(12) United States Patent
Lin et al.

(10) Patent No.: US 10,627,442 B2
(45) Date of Patent: Apr. 21, 2020

(54) METHOD FOR ESTIMATING RESISTANCES OF A SOURCE CONTACT AND A DRAIN CONTACT OF A MOS TRANSISTOR

(71) Applicant: NANYA TECHNOLOGY CORPORATION, New Taipei (TW)

(72) Inventors: Shih-Ting Lin, New Taipei (TW); Kung-Ming Fan, Taoyuan (TW); Hung-Hsiang Xsiao, New Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 15/911,529

(22) Filed: Mar. 5, 2018

(65) Prior Publication Data

US 2019/0178931 A1 Jun. 13, 2019

Related U.S. Application Data

(60) Provisional application No. 62/595,800, filed on Dec. 7, 2017.

(51) Int. Cl.
*G01R 31/26* (2020.01)
*G01R 27/08* (2006.01)

(52) U.S. Cl.
CPC .......... *G01R 31/2621* (2013.01); *G01R 27/08* (2013.01)

(58) Field of Classification Search
None
See application file for complete search history.

(56) References Cited

U.S. PATENT DOCUMENTS

| | | | | |
|---|---|---|---|---|
| 2006/0028221 A1* | 2/2006 | Hasegawa | ............ | G01R 27/205 324/754.03 |
| 2009/0079446 A1* | 3/2009 | Chatterjee | .......... | G01R 31/2621 324/719 |
| 2012/0227020 A1* | 9/2012 | Dewey, III | ................ | G06F 8/61 716/103 |
| 2013/0289964 A1* | 10/2013 | Lu | ........................ | G06F 17/5036 703/13 |
| 2014/0343880 A1* | 11/2014 | Wu | .................... | G01R 31/2621 702/65 |

* cited by examiner

*Primary Examiner* — Melissa J Koval
*Assistant Examiner* — Nasima Monsur
(74) *Attorney, Agent, or Firm* — Geissler, Olds & Lowe, P.C.

(57) ABSTRACT

A method for estimating resistances of a source contact and a drain contact of a MOS transistor includes the following steps. A MOS transistor is provided. The MOS transistor includes a substrate, a gate, a source region and a drain region, a source contact electrically connected to the source region, and a drain contact electrically connected to the drain region. A resistance difference between a source contact resistance and a drain contact resistance is obtained. A resistance sum of the source contact resistance and the drain contact resistance is obtained. The source contact resistance and the drain contact resistance are calculated based on the resistance sum of the source contact resistance and the drain contact resistance, and on the resistance difference between the source contact resistance and the drain contact resistance.

8 Claims, 7 Drawing Sheets

METHOD FOR ESTIMATING RESISTANCES OF A SOURCE CONTACT AND A DRAIN CONTACT OF A MOS TRANSISTOR

PRIORITY CLAIM AND CROSS-REFERENCE

This application claims priority of U.S. provisional application Ser. No. 62/595,800, filed on Dec. 7, 2017, which is incorporated herein by reference in its entirety.

TECHNICAL FIELD

The present disclosure relates to a method for estimating resistances of a source contact and a drain contact of a MOS transistor, and more particularly, to a method for extracting resistances of a source contact and a drain contact from an overall resistance of the MOS transistor.

DISCUSSION OF THE BACKGROUND

Metal oxide semiconductor (MOS) transistors have several sources of electrical resistance connected in series, including a resistance of a source contact, a resistance of a source region, a resistance of a drain region and a resistance of a drain contact. Accurate measurement of the individual resistance values of the source contact, the source region, the drain region and the drain contact is critical for assessing integrated circuit performance.

As the scaling down of the gate length in the MOS transistor continues in pursuit of better device performance and higher integration density, the parasitic source and drain resistances become critical in modeling and characterization of MOS transistors. The parasitic source and drain resistances resulting from the source contact and the drain contact may lead to degradation of drive current. Therefore, it is essential to accurately measure the resistances of the source contact and the drain contact when accessing integrated circuit performance.

This Discussion of the Background section is for background information only. The statements in this Discussion of the Background are not an admission that the subject matter disclosed in this section constitutes a prior art to the present disclosure, and no structure of this section may be used as an admission that any structure of this application, including this Discussion of the Background section, constitutes prior art to the present disclosure.

SUMMARY

One aspect of the present disclosure provides a method for estimating resistances of a source contact and a drain contact of a MOS transistor. The method includes the following steps. A MOS transistor is provided. The MOS transistor includes a substrate, a gate, a source region and a drain region, a source contact electrically connected to the source region, and a drain contact electrically connected to the drain region. A resistance difference between a source contact resistance and a drain contact resistance is obtained. A resistance sum of the source contact resistance and the drain contact resistance is obtained. The source contact resistance and the drain contact resistance are calculated based on the resistance sum of the source contact resistance and the drain contact resistance, and on the resistance difference between the source contact resistance and the drain contact resistance.

In some embodiments, the method further includes operating the MOS transistor in a forward configuration, including grounding the substrate and the source contact, applying a set of first gate voltages to the gate, and measuring a set of potentials across the gate and the source contact, a set of potentials across the drain contact and source contact, and a set of currents from the drain contact to the source contact when the set of first gate voltages is applied to the gate.

In some embodiments, the method further includes operating the MOS transistor in a reverse configuration, including grounding the substrate and the drain contact, applying a set of second gate voltages to the gate, and measuring a set of potentials across the gate and the drain contact, a set of potentials across the source contact and the drain contact, and a set of currents from the source contact to the drain contact when the set of second gate voltages is applied to the gate.

In some embodiments, the resistance difference between the source contact resistance and the drain contact resistance is obtained by equation (1) $Vgs=VgS+RSC*Idsn$, and equation (2) $Vgd=VgD+RDC*Idsi$, wherein $Vgs$ is a potential across the gate and the source contact; $VgS$ is a potential across the gate and the source region; $RSC$ is the resistance of the source contact; $Idsn$ is the current from the drain contact to the source contact; $Vgd$ is a potential across the gate and the drain contact; $VgD$ is a potential across the gate and the drain region; $RDC$ is the resistance of the drain contact; and $Idsi$ is the current from the source contact to the drain contact.

In some embodiments, the resistance difference between the source contact resistance and the drain contact resistance is obtained as a two-variable equation.

In some embodiments, the resistance sum of the source contact resistance and the drain contact resistance is obtained by equation (3) $Vds=VDS+(RDC+RSC)*Idsn$, and equation (4) $Vsd=VSD+(RDC+RSC)*Idsi$, wherein $Vds$ is a potential across the drain contact and the source contact; $VDS$ is a potential across the drain region and the source region; $Vsd$ is a potential across the source contact and the drain contact; and $VSD$ is a potential across the source region and the drain region.

In some embodiments, the resistance sum of the source contact resistance and the drain contact resistance is calculated in the form of a two-variable equation.

In some embodiments, the two-variable equation of the resistance sum of the source contact resistance and the drain contact resistance is calculated by a curve fitting method.

In some embodiments, the two-variable equation of the resistance sum of the source contact resistance and the drain contact resistance is calculated by the least squares method.

In some embodiments, the resistance of the source contact and the resistance of the drain contact are calculated by solving the two-variable equation of the resistance sum of the source contact resistance and the drain contact resistance, and by solving the two-variable equation of the resistance difference between the source contact resistance and the drain contact resistance.

In some embodiments of the present disclosure, a method for estimating resistances of a source contact and a drain contact of a MOS transistor is provided. The method uses four equations derived from Ohm's law to estimate the resistance of a source contact and the resistance of a drain contact of a MOS transistor. The method is designed to estimate the resistance of a source contact and the resistance of a drain contact of a single MOS transistor, and thus can be applied to various semiconductor devices such as a vertical MOS transistor, a horizontal MOS transistor, and the like. The method is able to accurately extract the resistance of the source contact and the resistance of the drain contact from the overall resistance of the MOS transistor by a simple methodology, and can alleviate the influence of parasitic resistance. Accordingly, the integrated circuit performance can be accurately accessed.

In contrast, conventional methods use a complex measurement technique which connects voltage and ampere meters to the MOS transistor, and may cause additional parasitic resistance.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1A:
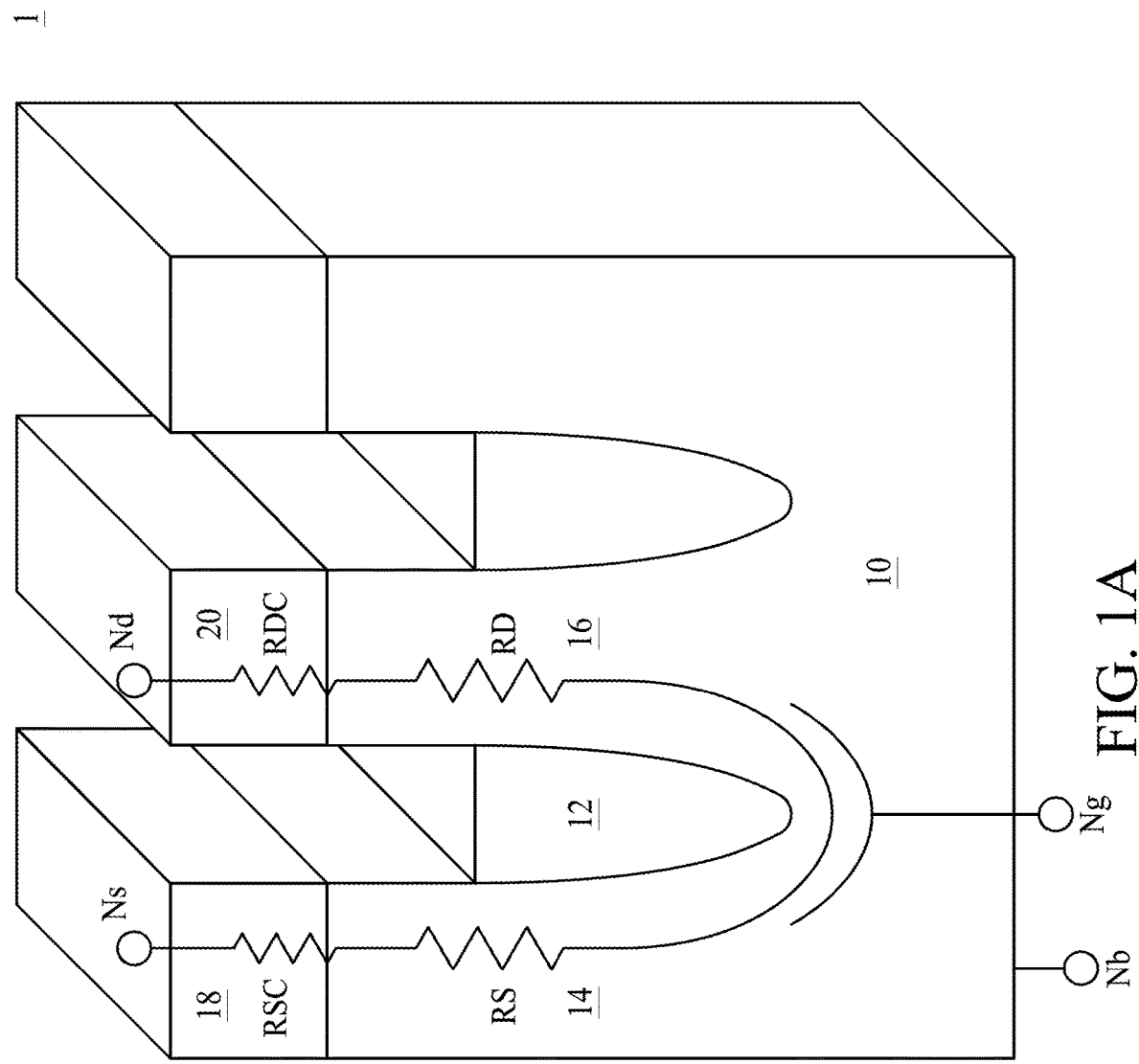
FIG. 1A is a perspective view of a MOS transistor, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

In some embodiments of the present disclosure, a method for estimating resistances of a source contact and a drain contact of a MOS transistor is provided. The method is designed to extract the resistances of a source contact and a drain contact from a circuit scheme of a single MOS transistor, and thus can be applied to various types of semiconductor devices.

Figure 1B:
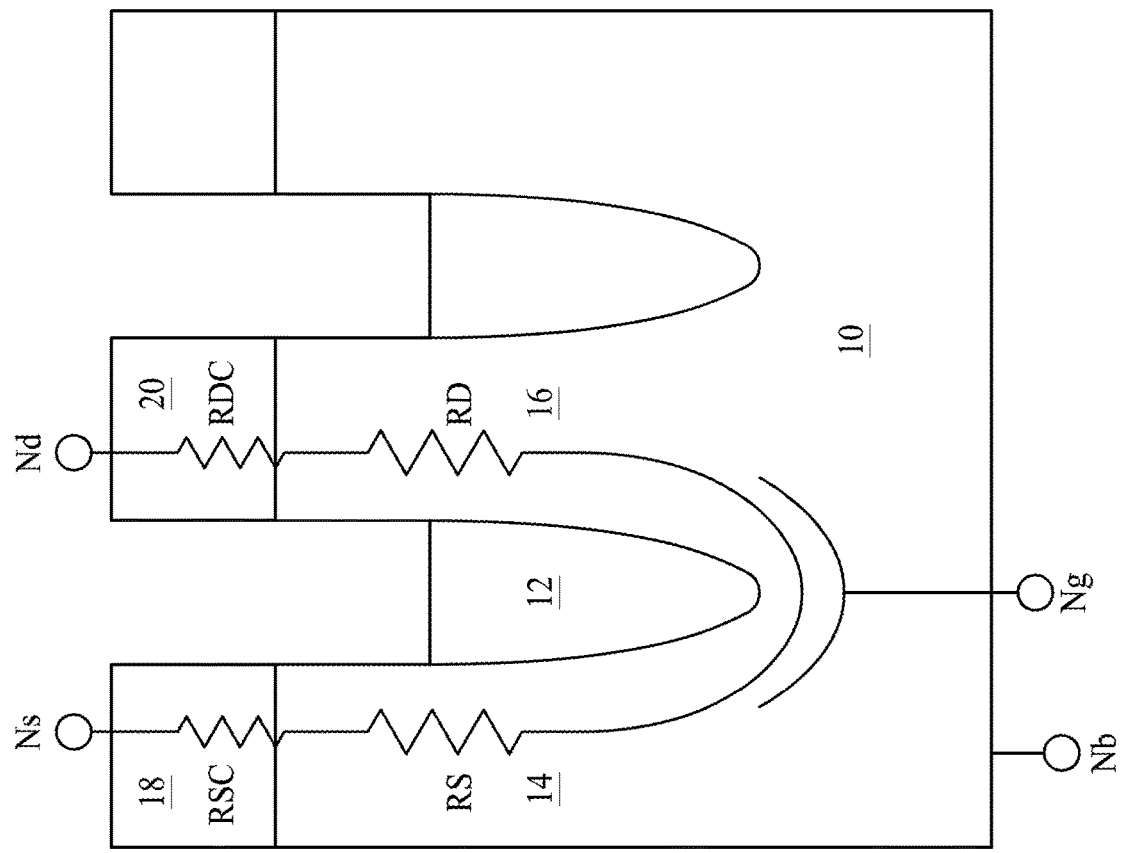
FIG. 1B is a cross-sectional view of a MOS transistor, in accordance with some embodiments of the present disclosure.

FIG. 1A is a perspective view of a MOS transistor, in accordance with some embodiments of the present disclosure, and FIG. 1B is a cross-sectional view of a MOS transistor, in accordance with some embodiments of the present disclosure. As shown in FIG. 1A and FIG. 1B, the MOS transistor 1 may include a substrate 10, a gate 12, a source region 14, a drain region 16, a source contact 18 electrically connected to the source region 14, and a drain contact 20 electrically connected to the drain region 16. The MOS transistor 1 may further include a gate oxide layer (not shown) between the gate 12 and the substrate 10, and a channel (not labeled) between the source region 14 and the drain region 16.

Figure 2:
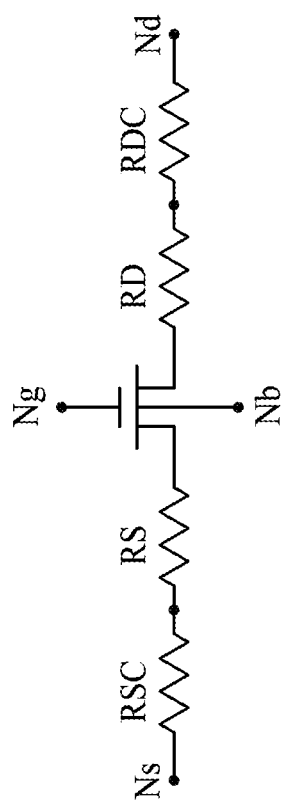
FIG. 2 is an equivalent circuit diagram of the MOS transistor of FIG. 1A and FIG. 1B, in accordance with some embodiments of the present disclosure.

FIG. 2 is an equivalent circuit diagram of the MOS transistor of FIG. 1A and FIG. 1B, in accordance with some embodiments of the present disclosure. As shown in FIG. 1A, FIG. 1B and FIG. 2, the equivalent circuit of the MOS transistor 1 includes a source contact resistance RSC, a source region resistance RS, a drain region resistance RD and a drain contact resistance RDC electrically connected in series. In some embodiments, the equivalent circuit of the MOS transistor 1 has four nodes, including a bulk node Nb, a gate node Ng, a source node Ns and a drain node Nd, to supply signals to and to receive signals from the substrate 10, the gate 12, the source contact 18 and the drain contact 20, respectively. The bulk node Nb is electrically connected to the substrate 10. The gate node Ng is electrically connected to the gate 12. The source node Ns is electrically connected to the source contact 18. The drain node Nd is electrically connected to the drain contact 20.

Figure 3:
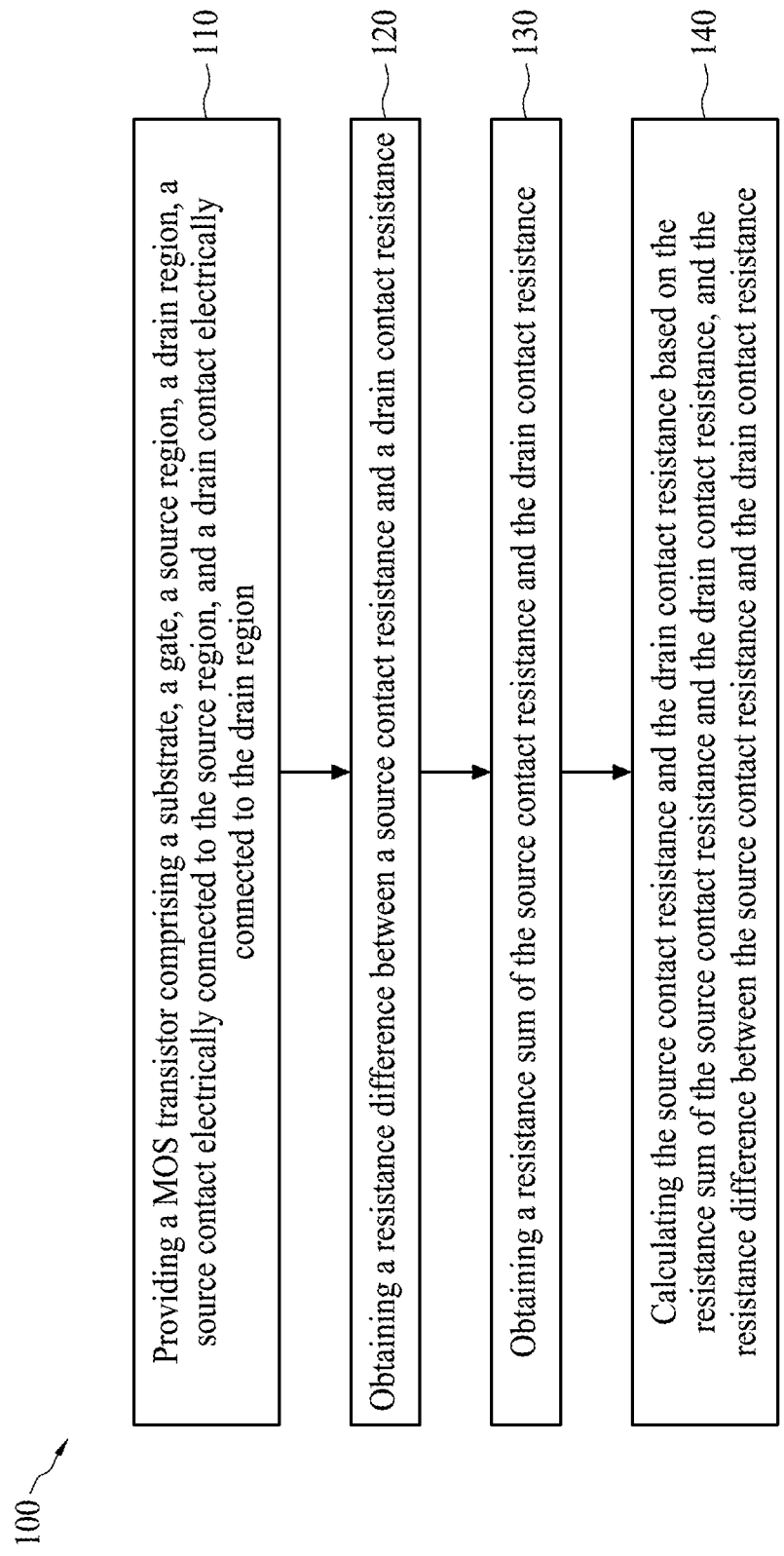
FIG. 3 is a flow diagram illustrating a method for estimating resistances of a source contact and a drain contact of a MOS transistor, in accordance with some embodiments of the present disclosure.

FIG. 3 is a flow diagram illustrating a method for estimating resistances of a source contact and a drain contact of a MOS transistor, in accordance with some embodiments of the present disclosure. As shown in FIG. 3, the method 100 for estimating resistances of a source contact and a drain contact of a MOS transistor begins with a step 110 in which a MOS transistor is provided. The MOS transistor includes a substrate, a gate, a source region, a drain region, a source contact electrically connected to the source region, and a drain contact electrically connected to the drain region. The method 100 for estimating resistances of a source contact and a drain contact of a MOS transistor proceeds with a step 120 in which a resistance difference between a source contact resistance and a drain contact resistance is obtained. The method 100 for estimating resistances of a source contact and a drain contact of a MOS transistor continues with a step 130 in which a resistance sum of the source contact resistance and the drain contact resistance is obtained. The method 100 for estimating resistances of a source contact and a drain contact of a MOS transistor proceeds with a step 140 in which the source contact resistance and the drain contact resistance are calculated based on the resistance sum of the source contact resistance and the drain contact resistance, and on the resistance difference between the source contact resistance and the drain contact resistance.

The method 100 is merely an example, and is not intended to limit the present disclosure beyond what is explicitly recited in the claims. Additional steps can be provided before, during, and after the method 100, and some operations described can be replaced, eliminated, or moved around for additional embodiments of the method.

Figure 4A:
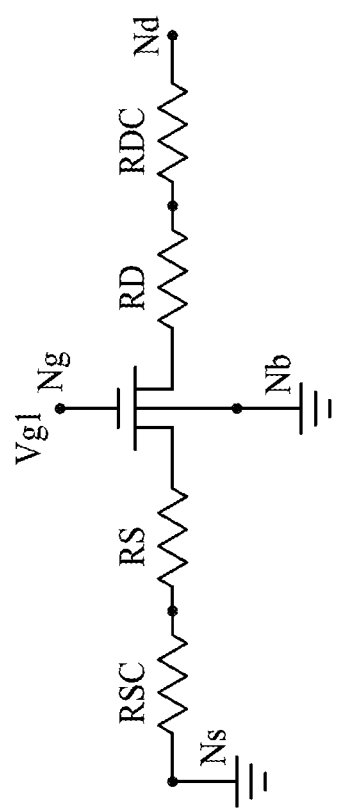
FIG. 4A is a schematic diagram illustrating the MOS transistor in a forward configuration.
Figure 4B:
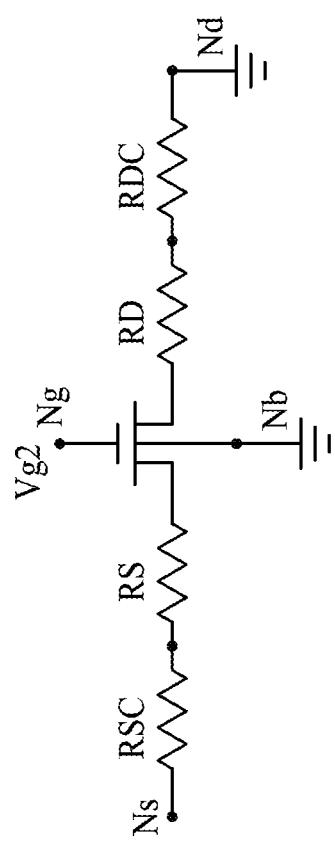
FIG. 4B is a schematic diagram illustrating the MOS transistor in a reverse configuration.

The method 100 may further include operating the MOS transistor in a forward configuration and in a reverse configuration, and measuring related potentials and currents in the forward configuration and in the reverse configuration. FIG. 4A is a schematic diagram illustrating the MOS transistor in a forward configuration, and FIG. 4B is a schematic diagram illustrating the MOS transistor in a reverse configuration. As shown in FIG. 1A, FIG. 1B and FIG. 4A, the substrate 10 and the source contact 18 are grounded in the forward configuration. A set of first gate voltages Vg1 of different voltage values is applied to the gate 12 through the gate node Ng by, for example, an adjustable power supplier when the MOS transistor is in the forward configuration. When the set of first gate voltages Vg1 is applied to the gate 12, a set of potentials Vgs across the gate 12 and the source contact 18, a set of potentials Vds across the drain contact 20 and source contact 18, and a set of currents Idsn from the drain contact 20 to the source contact 18 can be measured.

As shown in FIG. 1A, FIG. 1B and FIG. 4B, the substrate 20 and the drain contact 20 are grounded in the reverse configuration. A set of second gate voltages Vg2 of different voltage values is applied to the gate 12 through the gate node Ng by, for example, an adjustable power supplier when the MOS transistor is in the reverse configuration. When the set of second gate voltages Vg2 is applied to the gate 12, a set of potentials Vgd across the gate 12 and the drain contact 20, a set of potentials Vsd across the source contact 18 and the drain contact 20 and a set of currents Isdi from the source contact 18 to the drain contact 20 can be measured.

In some embodiments, the resistance difference between the source contact resistance RSC and the drain contact resistance RDC can be obtained using the potentials and currents measured in the forward configuration and/or in the reverse configuration by the following equations (1) and (2):

$$Vgs = VgS + RSC*Idsn \quad (1); \text{ and}$$

$$Vgd = VgD + RDC*Idsi \quad (2).$$

Where:
Vgs is a potential across the gate and the source contact;
VgS is a potential across the gate and the source region;
RSC is the resistance of the source contact;
Idsn is the current from the drain contact to the source contact;

Vgd is a potential across the gate and the drain contact;
VgD is a potential across the gate and the drain region;
RDC is the resistance of the drain contact; and
Idsi is the current from the source contact to the drain contact.

In some embodiments, the resistance difference (RSC−RDC) between the source contact resistance RSC and the drain contact resistance RDC can be obtained by the following calculations.

Subtract equation (1) from equation (2) to obtain an equation (2)-1:

$$Vgs - Vgd = (VgS + RSC*Idsn) - (VgD + RDC*Idsi) \quad (2)\text{-}1.$$

Under the condition that VgS−VTn=VgD−VTi (where VTn is the threshold voltage of the MOS transistor in the forward configuration, and VTi is the threshold voltage of the MOS transistor in the reverse configuration), Idsn is equal to Idsi (i.e., Idsn=Idsi). Therefore, Idsn and Idsi can be expressed in terms of Ids. Replace Idsn and Idsi with Ids to obtain an equation (2)-2:

$$Vgs - Vgd = VgS - VgD + Ids(RSC - RDC) \quad (2)\text{-}2.$$

Replace VgS−VgD with VTn−VTi to obtain an equation (2)-3:

$$Vgs - Vgd = VTn - VTi + Ids(RSC - RDC) \quad (2)\text{-}3.$$

Derive equation (2)-3 to obtain an equation (a):

$$Ids(RSC - RDC) = (Vgs - Vgd) - (VTn - VTi) \quad (a).$$

Since Ids, Vgs, Vgd, VTn and VTi can be measured from the MOS transistor and are known, the resistance difference (RSC−RDC) between the source contact resistance RSC and the drain contact resistance RDC can be obtained in the form of a two-variable equation.

In some embodiments, the resistance sum (RSC+RDC) of the source contact resistance RSC and the drain contact resistance RDC can be obtained from the following equations (3) and (4):

$$Vds = VDS + (RDC + RSC)*Idsn \quad (3); \text{ and}$$

$$Vsd = VSD + (RDC + RSC)*Idsi \quad (4).$$

Where:
Vds is a potential across the drain contact and the source contact;
VDS is a potential across the drain region and the source region;
Vsd is a potential across the source contact and the drain contact; and
VSD is a potential across the source region and the drain region.

In some embodiments, the resistance sum (RSC+RDC) of the source contact resistance RSC and the drain contact resistance RDC can be obtained by the following calculations:

Divide equation (3) by Idsn to obtain:

$$Vds/Idsn = VDS/Idsn + (RDC + RSC) \quad (3)\text{-}1.$$

Since the source contact resistance RSC, the source region resistance RS, the drain region resistance RD and the drain contact resistance RDC are electrically connected in series, Idsn is equal to IDSn (where IDSn is the current from the drain region to the source region). Therefore, IDSn can be expressed in term of IDS.

Replace Idsn with IDS in equation (3)-1 to obtain an equation (3)-2:

$$Vds/Idsn = VDS/IDS + (RDC + RSC) \quad (3)\text{-}2.$$

Since IDS can be calculated from the following theoretical formula:

$$IDS = u * C_{ox}(W/L)(Vgs-VTn)VDS,$$

Where:
u is the carrier mobility;
$C_{ox}$ is the capacitance per unit area of gate oxide of the MOS transistor;
W is the width of the channel of the MOS transistor; and
L is the length of the channel of the MOS transistor.

Derive equation (3)-2 to obtain an equation (3)-3:

$$Vds/Idsn \approx VDS/(u*C_{ox}(W/L)(VgS-VTn)VDS) + (RDC+RSC) \quad (3)\text{-}3.$$

Since VDS is significantly greater than Idsn*VTn, equation (1) can be reformed as:

$$VgS = Vgs - Idsn*RSC \approx Vgs \quad (1)\text{-}1.$$

Replace VgS with Vgs in equation (3)-3 to obtain an equation (b):

$$Vds/Idsn \approx [(1/(u*C_{ox}(W/L))(1/(Vgs-VTn))] + (RDC+RSC) \quad (b).$$

In some embodiments, equation (4) can be derived using an approach similar to that used to obtain an equation (b'):

$$Vsd/Idsi \approx [(1/(u*C_{ox}(W/L))(1/(Vgd-VTi))] + (RDC+RSC) \quad (b').$$

Figure 5:
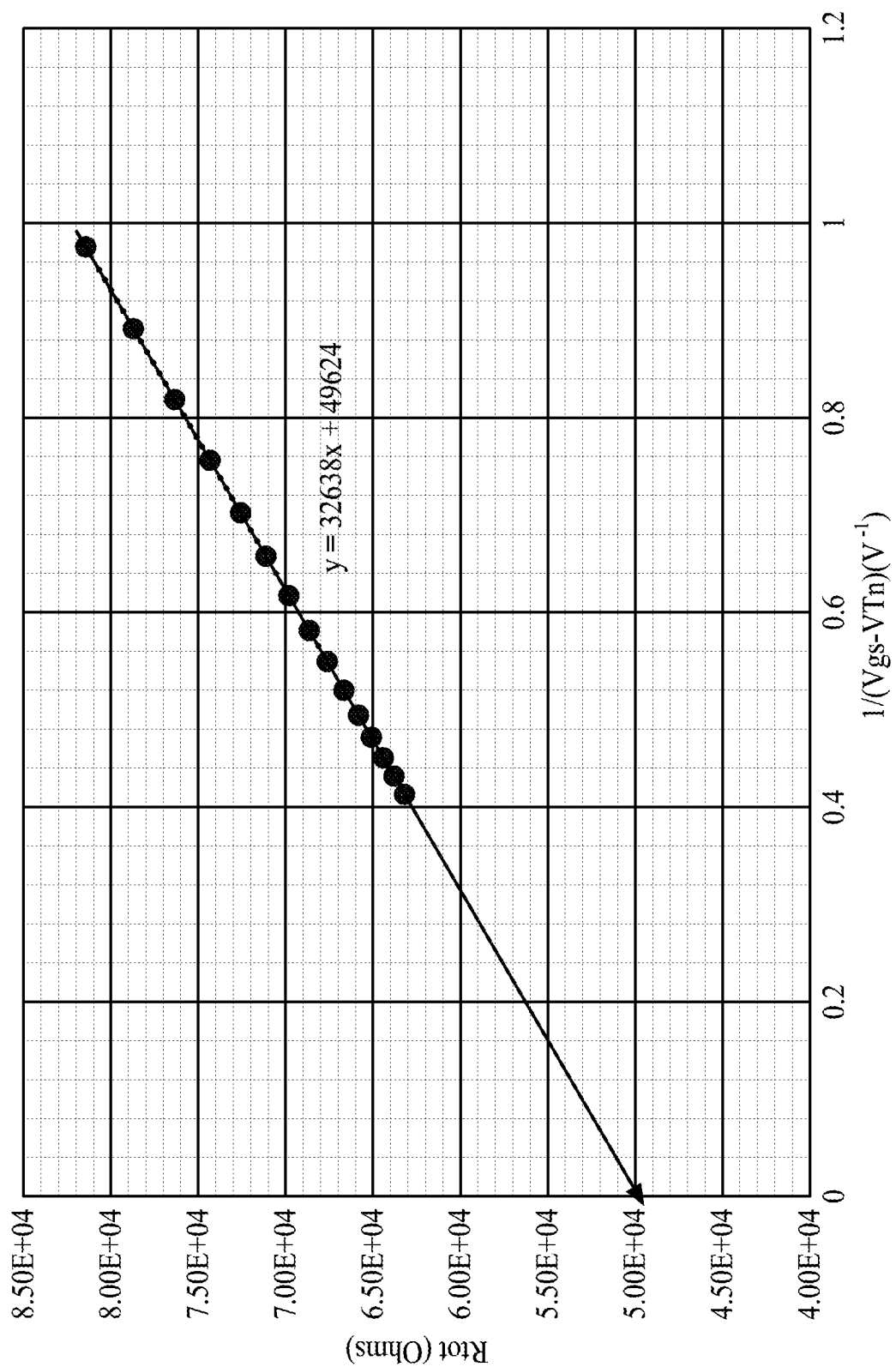
FIG. 5 is a plot illustrating a relation between Rtot(Vds/Idsn) and 1/(Vgs−VTn) when different potentials are applied to the gate, in accordance with some embodiments of the present disclosure.

In some embodiments, the resistance sum (RSC+RDC) of the source contact resistance RSC and the drain contact resistance RDC can be estimated by a curve fitting method. For example, equation (b) or equation (b') can be plotted as a graph using the set of potentials Vds, the set of potentials Vgs and the set of currents Idsn as data to estimate the resistance sum (RSC+RDC) of the source contact resistance RSC and the drain contact resistance RDC. FIG. 5 is a plot illustrating a relation between Rtot(Vds/Idsn) and 1/(Vgs−VTn) when different potentials are applied to the gate, in accordance with some embodiments of the present disclosure. As shown in FIG. 5, the resistance sum (RSC+RDC) of the source contact resistance RSC and the drain contact resistance RDC can be known when 1/(Vgs−VTn) approaches zero, i.e., when Vgs approaches infinity. Accordingly, the resistance sum (RSC+RDC) of the source contact resistance RSC and the drain contact resistance RDC can be estimated by the point where the slope of the curve intersects the Y-axis in the graph. As a result, the resistance sum (RSC+RDC) of the source contact resistance RSC and the drain contact resistance RDC can be obtained in the form of a two-variable equation. In some embodiments, the resistance sum (RSC+RDC) of the source contact resistance RSC and the drain contact resistance RDC can be obtained by another mathematical calculation, such as the least squares method or the like.

Compared with the resistance sum measured by a complex silicon hardware measurement, which is about 42613.5 ohm, the estimated resistance sum (RSC+RDC) of the source contact resistance RSC and the drain contact resistance RDC measured by the method of the present disclosure is about 49624 ohm as shown in FIG. 5, which is close to the resistance sum measured by a complex silicon hardware measurement.

As an equation of the resistance sum (RSC+RDC) of the source contact resistance RSC and the drain contact resistance RDC and an equation of the resistance difference (RSC−RDC) between the source contact resistance RSC and the drain contact resistance RDC are obtained, the individual values of the source contact resistance RSC and the drain contact resistance RDC can be calculated by solving the two simultaneous equations of the two variables.

In some embodiments of the present disclosure, the calculation can be implemented by a processing unit such as a computer, and stored in a storage device such as a memory device. The supply and the measurement of voltage signals or current signals can be implemented by probes of a simple voltage meter or an ampere meter.

In some embodiments of the present disclosure, a method for estimating resistances of a source contact and a drain contact of a MOS transistor is provided. The method uses four equations derived from Ohm's law to estimate the resistance of a source contact and the resistance of a drain contact of a MOS transistor. The method is designed to estimate the resistance of a source contact and the resistance of a drain contact of a single MOS transistor, and thus can be applied to various semiconductor devices such as a vertical MOS transistor, a horizontal MOS transistor and the like. The method is able to accurately extract the resistance of the source contact and the resistance of the drain contact from the overall resistance of the MOS transistor by a simple methodology, and can alleviate the influence of parasitic resistance. Accordingly, the integrated circuit performance can be accurately accessed.

In contrast, conventional methods use a complex measurement technique which connects voltage and ampere meters to the MOS transistor, and may cause additional parasitic resistance.

One aspect of the present disclosure provides a method for estimating resistances of a source contact and a drain contact of a MOS transistor. The method includes the following steps. A MOS transistor is provided. The MOS transistor includes a substrate, a gate, a source region and a drain region, a source contact electrically connected to the source region, and a drain contact electrically connected to the drain region. A resistance difference between a source contact resistance and a drain contact resistance is obtained. A resistance sum of the source contact resistance and the drain contact resistance is obtained. The source contact resistance and the drain contact resistance are calculated based on the resistance sum of the source contact resistance and the drain contact resistance, and on the resistance difference between the source contact resistance and the drain contact resistance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for estimating resistances of a source contact and a drain contact of a MOS transistor, comprising:
providing the MOS transistor, comprising:
a substrate;
a gate;
a source region and a drain region;
the source contact electrically connected to the source region; and
the drain contact electrically connected to the drain region;
operating the MOS transistor in a forward configuration to obtain a set of potentials across the gate and the source contact, a set of potentials across the drain contact and the source contact, and a set of currents from the drain contact to the source contact when a set of first gate voltages is applied to the gate and wherein the substrate and the source contact are grounded;
operating the MOS transistor in a reverse configuration to obtain a set of potentials across the gate and the drain contact, a set of potentials across the source contact and the drain contact, and a set of currents from the source contact to the drain contact when a set of second gate voltages is applied to the gate and wherein the substrate and the drain contact are grounded;
obtaining a resistance difference between a source contact resistance and a drain contact resistance;
obtaining a resistance sum of the source contact resistance and the drain contact resistance; and
calculating the source contact resistance and the drain contact resistance based on the resistance sum of the source contact resistance and the drain contact resistance, and on the resistance difference between the source contact resistance and the drain contact resistance; wherein the resistance difference is obtained by an equation:

$$Idsn(RSC-RDC)=(Vgs-Vgd)-(VTn-VTi); \text{ and}$$

wherein (RSC−RDC)=((Vgs−Vgd)−(VTn−VTi))/Idsn;
the resistance sum is obtained by an equation:

$$Vds/Idsn=VDS/Idsn+(RDC+RSC), \text{ and}$$

wherein (RDC+RSC)=(Vds/Idsn)−(VDS/Idsn);
wherein RSC is the resistance of the source contact, RDC is the resistance of the drain contact, Idsn is a current from the drain contact to the source contact, Vgs is a potential across the gate and the source contact, Vgd is a potential across the gate and the drain contact, VTn is a threshold voltage of the MOS transistor in the forward configuration, VTi is a threshold voltage of the MOS transistor in the reverse configuration, and VDS is a potential across the drain region and the source regions.

2. The method of claim 1, wherein the resistance difference between the source contact resistance and the drain contact resistance is obtained by:

$$Vgs=VgS+RSC*Idsn \qquad (1); \text{ and}$$

$$Vgd=VgD+RDC*Idsi \qquad (2),$$

wherein
Vgs is the potential across the gate and the source contact;
VgS is a potential across the gate and the source region;
RSC is the resistance of the source contact;
Idsn is the current from the drain contact to the source contact;
Vgd is the potential across the gate and the drain contact;
VgD is a potential across the gate and the drain region;
RDC is the resistance of the drain contact; and
Idsi is a current from the source contact to the drain contact.

3. The method of claim 2, wherein the resistance difference between the source contact resistance and the drain contact resistance is calculated in a form of a two-variable equation.

4. The method of claim 3, wherein the resistance sum of the source contact resistance and the drain contact resistance is obtained by:

$$Vds=VDS+(RDC+RSC)*Idsn \qquad (3); \text{ and}$$

$$Vsd=VSD+(RDC+RSC)*Idsi \qquad (4),$$

wherein
Vds is the potential across the drain contact and the source contact;
VDS is the potential across the drain region and the source region;
Vsd is a potential across the source contact and the drain contact; and
VSD is a potential across the source region and the drain region.

5. The method of claim 4, wherein the resistance sum of the source contact resistance and the drain contact resistance is calculated in the form of the two-variable equation.

6. The method of claim 5, wherein the two-variable equation of the resistance sum of the source contact resistance and the drain contact resistance is calculated by a curve fitting method.

7. The method of claim 5, wherein the two-variable equation of the resistance sum of the source contact resistance and the drain contact resistance is calculated by least squares method.

8. The method of claim 6, wherein the resistance of the source contact and the resistance of the drain contact are calculated by solving the two-variable equation of the resistance sum of the source contact resistance and the drain contact resistance and the two-variable equation of the resistance difference between the source contact resistance and the drain contact resistance.

* * * * *